United States Patent
Porshnev et al.

(10) Patent No.: US 7,674,723 B2
(45) Date of Patent: Mar. 9, 2010

(54) PLASMA IMMERSION ION IMPLANTATION USING AN ELECTRODE WITH EDGE-EFFECT SUPPRESSION BY A DOWNWARDLY CURVING EDGE

(75) Inventors: Peter I. Porshnev, San Jose, CA (US); Majeed A. Foad, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/069,425

(22) Filed: Feb. 6, 2008

(65) Prior Publication Data

US 2009/0197010 A1 Aug. 6, 2009

(51) Int. Cl.
*H01L 21/31* (2006.01)
*H01L 21/469* (2006.01)
*C23C 16/00* (2006.01)

(52) U.S. Cl. ............... 438/771; 118/723 R; 118/723 E
(58) Field of Classification Search ............ 422/186.29; 118/723 R
See application file for complete search history.

(56) References Cited

U.S. PATENT DOCUMENTS

| | | | |
|---|---|---|---|
| 5,423,918 A | 6/1995 | Gupta et al. ............ 134/1 |
| 6,470,823 B2 * | 10/2002 | Yajima et al. .......... 118/723 E |
| 2001/0023742 A1 * | 9/2001 | Schmitt ................ 156/345 |
| 2001/0053422 A1 * | 12/2001 | Lee et al. ............... 427/569 |
| 2005/0103623 A1 | 5/2005 | Tolmachev et al. ..... 204/298.06 |

FOREIGN PATENT DOCUMENTS

JP 07058083 A 3/1995

* cited by examiner

*Primary Examiner*—Ha Tran T Nguyen
*Assistant Examiner*—Valerie Brown
(74) *Attorney, Agent, or Firm*—Law Office of Robert M. Wallace

(57) ABSTRACT

In a plasma reactor, RF bias power is applied from an RF bias power generator to a disk-shaped electrode underlying and insulated from a workpiece and having a circumferential edge underlying a circumferential edge of the workpiece. The RF bias power is sufficient to produce a high RF bias voltage on the workpiece on the order of 0.5-20 kV. Non-uniformity in distribution of plasma across the workpiece is reduced by providing a curvature in a peripheral edge annulus of said electrode whereby the peripheral annulus slopes away from the workpiece support surface. The peripheral edge annulus corresponds to a small fraction of an area of said electrode. The remainder of the electrode encircled by the peripheral annulus has a flat shape.

18 Claims, 3 Drawing Sheets

PLASMA IMMERSION ION IMPLANTATION USING AN ELECTRODE WITH EDGE-EFFECT SUPPRESSION BY A DOWNWARDLY CURVING EDGE

BACKGROUND

Plasma immersion ion implantation is performed by generating a plasma containing ions of species to be implanted in a semiconductor wafer or workpiece. The plasma may be generated using a plasma source such as a toroidal plasma source at the reactor chamber ceiling. Any other plasma source (e.g., RF inductively coupled plasma source) could be used for generating high density plasma above the wafer surface. Ion energy sufficient to achieve a desired ion implantation depth profile below the wafer surface is provided by coupling a high RF bias voltage (e.g., 0.5 kV to 20 kV of capacitively coupled RF plasma) to the semiconductor wafer through an insulated cathode electrode within the wafer support pedestal. If the wafer support pedestal is incorporated within an electrostatic chuck, then the insulated cathode electrode may be a thin metal (e.g., molybdenum) mesh separated from the wafer support surface by a thin (e.g., 1 mm thick) insulation layer. The insulation layer overlying the metal mesh electrode is part of a complete insulation layer within which the metal mesh electrode is encapsulated. The metal mesh electrode is flat in order to provide a uniformly perpendicular electric field across the surface of the wafer. This feature enables the ion trajectory near the wafer surface to be uniformly perpendicular across the entire wafer surface. Such uniformity is needed to achieve uniform distribution of ion implant dose across the wafer surface, leading to uniform distribution of sheet resistance across the wafer surface.

Such a plasma immersion ion implantation process is hampered by non-uniform distribution across the wafer surface of retained implant dose and polysilicon etch rate. The non-uniformity of retained implant dose is reflected in the non-uniform distribution across the wafer surface of measured sheet resistance, the non-uniformity being on the order of about 2-4%. With the recent progress in semiconductor circuit miniaturization, with feature sizes below 45 nanometers, it is becoming imperative that this non-uniformity be reduced to less than 1%. Currently, there has seemed to be no solution to this problem.

SUMMARY

A plasma process such as plasma immersion ion implantation is carried out on a semiconductor workpiece. The process includes supporting the workpiece on a workpiece support surface in a reactor chamber and generating a plasma in the chamber from a process gas by coupling RF plasma source power from an RF source power generator to said process gas. RF bias power is applied from an RF bias power generator to a disk-shaped electrode underlying and insulated from the workpiece and having a circumferential edge underlying a circumferential edge of the workpiece. The RF bias power is sufficient to produce a high RF bias voltage on the workpiece on the order of 0.5-20 kV. Non-uniformity in distribution of plasma across the workpiece is reduced by providing a curvature in a peripheral edge annulus of said electrode whereby the peripheral annulus slopes away from the workpiece support surface. The peripheral edge annulus corresponds to a small fraction of an area of said electrode. The remainder of the electrode encircled by the peripheral annulus has a flat shape.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1:
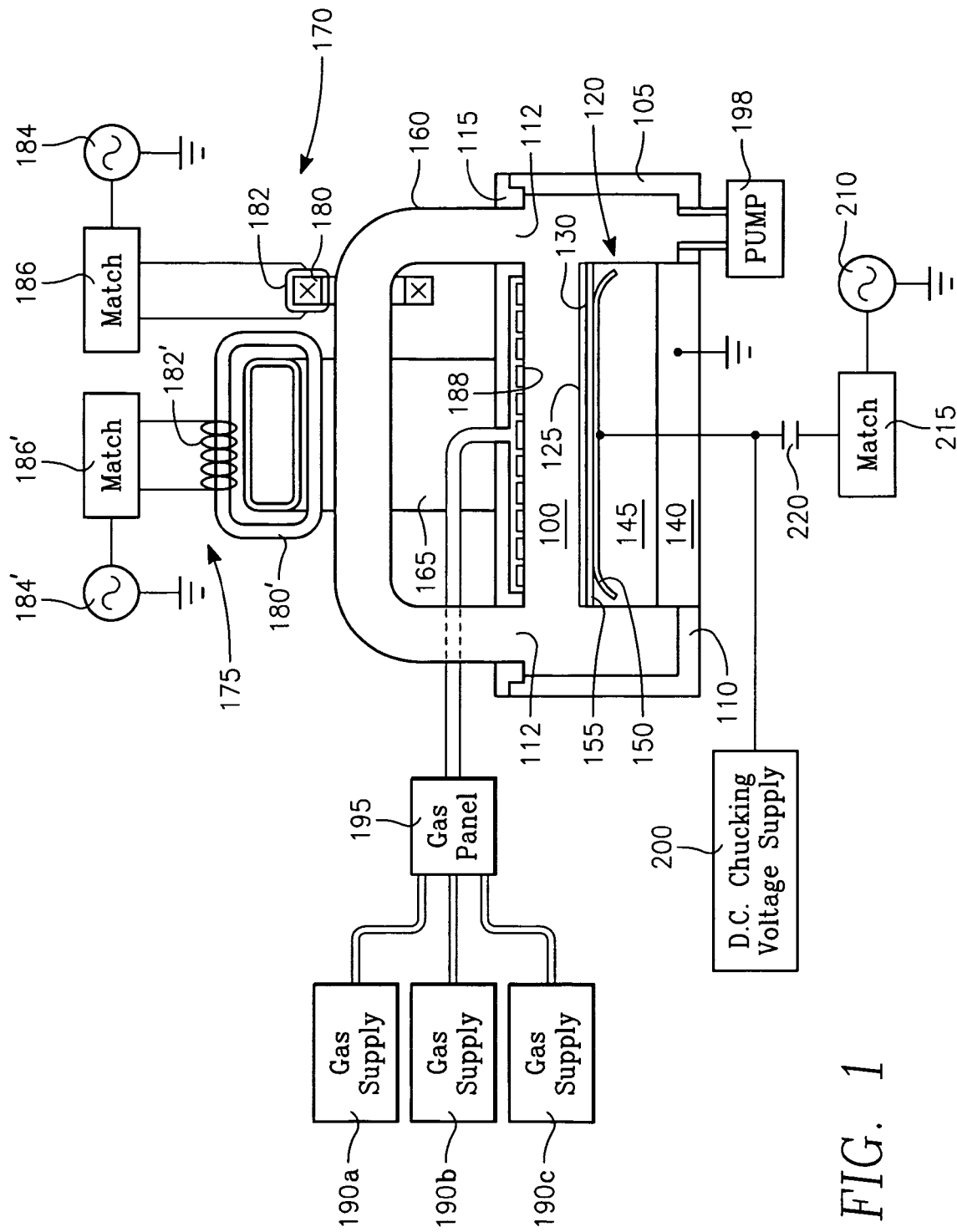
FIG. 1 illustrates a reactor in accordance with a first embodiment.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

We have discovered that the current problem of non-uniform distribution of retained ion implant dose is attributable to non-uniformity in the RF electric field across the wafer surface. We have also discovered a related problem of non-uniform distribution of sputtering or surface etching of the thin film structures that is attributable to the same cause, namely RF electric field non-uniformity at the wafer surface. We have further discovered that the electric field non-uniformity is due to edge effects of the cathode (metal mesh) electrode of the wafer support pedestal or electrostatic chuck, these edge effects being very apparent at the extremely high RF bias voltages only recently employed in the latest plasma immersion ion implantation reactors.

Ion implantation of the dopant species can be accompanied by unavoidable sputtering or surface etching of thin film features previously fabricated on the wafer surface, such as polycrystalline silicon (polysilicon) gate electrodes. We have discovered that such sputtering or surface etching is promoted by deviation of the ion trajectory from the perpendicular direction. The rate of surface etching increases with wafer temperature, so that uniformity in wafer temperature distribution causes non-uniformity in surface etch rate. The probability of sputtering and/or diversion of ions from implantation increases with variation of ion trajectory from the perpendicular. We have discovered that the non-uniformity in wafer temperature distribution arises from the non-uniformity in the RF electrical field. We believe that this is because non-uniform RF electrical field creates non-uniformities in the RF plasma heat load across the wafer surface.

Specifically, we have discovered that retained ion implant dosage is distributed in a non-uniform manner across the wafer, with a pronounced peak near the wafer edge. Furthermore, the surface etch rate or sputtering of thin film features on the wafer during ion implantation has a pronounced peak near the wafer edge. Such non-uniformities can lead to process failure, particularly at small thin film feature sizes on the order of 45 nm, for example.

We believe that such non-uniformities are due to the curvature in the RF electric field that exists at the circumference or edge of the metal mesh electrode underlying the wafer. Typically, the metal mesh electrode edge directly underlies the wafer edge. This curvature tends to focus ion trajectories toward the wafer edge, so that more ions impact a peripheral edge annulus of the wafer than elsewhere on the wafer surface. This increases the ion implant dose (number of ions implanted per unit area) in the peripheral edge annulus and increases the sputtering or surface etching (of polysilicon gate electrodes, for example) in the same region, leading to significant non-uniformities in implant dose distribution and etch rate distribution. Moreover, the peak in the electric field over the wafer edge can make plasma ion distribution more concentrated at the wafer edge, thereby increasing the RF plasma heat load at the wafer edge to create a non-uniform wafer temperature distribution. This leads to a non-uniformity or peak in the distribution of sputtering or surface etch rate at the peripheral edge annulus of the wafer.

Embodiments of the invention solve the foregoing problems by providing a topology in the edge of the metal mesh electrode that precisely compensates for the curvature in the electric field. Referring now to FIG. 1, a plasma immersion ion implantation reactor has a chamber 100 enclosed by a cylindrical side wall 105, a floor 110 and a ceiling 115. A wafer support pedestal 120 within the chamber 100 may be an electrostatic chuck capable of electrostatically clamping a semiconductor wafer 125 onto a wafer support surface 130 of the chuck 120. The chuck 120 may consist of a grounded conductive base layer 140, an insulating layer 145 overlying the base layer 140, a thin cathode electrode 150 overlying the insulating layer 145, and a top insulating layer 155 overlying the cathode electrode 150 and forming the wafer support surface 130. The material of the insulating layers 145, 155 may be a ceramic material. The cathode electrode 150 may be a thin metallic mesh formed of molybdenum.

The reactor of FIG. 1 has a toroidal plasma source including a pair of transverse external reentrant conduits 160, 165 each extending across the diameter of the chamber 100 and coupled at their ends to the interior of the chamber 100 through ports 112 in the ceiling 115. RF power applicators 170, 175 couple RF power into the interior of the reentrant conduits 160, 165 respectively. The RF power applicator 170 consists of a magnetically permeable ring 180 wrapped around the conduit 160, a conductive coil 182 wrapped around a portion of the ring 180 and an RF power generator 184 coupled to the coil 182 through an RF impedance match element 186. The RF power applicator 175 consists of a magnetically permeable ring 180' wrapped around the conduit 165, a conductive coil 182' wrapped around a portion of the ring 180' and an RF power generator 184' coupled to the coil 182' through an RF impedance match element 186'.

The ceiling 115 includes a gas distribution plate 188. Process gas supplies 190a, 190b, 190c furnish process gas through a user-controllable gas panel 195 to the gas distribution plate 188. The chamber 100 is evacuated by a vacuum pump 198.

The electrostatic chuck 120 further includes a user-controllable D.C. chucking voltage supply 200 connected to the mesh electrode 150. An RF bias power generator 210 capable of generating extremely high RF bias voltages is coupled to the mesh electrode 150 through an RF impedance match circuit 215 and through an optional isolation capacitor 220 (which may be included in the impedance match circuit 215). In order to provide a useful ion implantation depth profile in the wafer 125, the RF bias voltage generator 210 is operated at a sufficiently high power-level to produce an RF bias voltage across the plasma sheath at the wafer surface on the order of 10 kV or more. This voltage controls the ion implantation depth profile.

Figure 2:
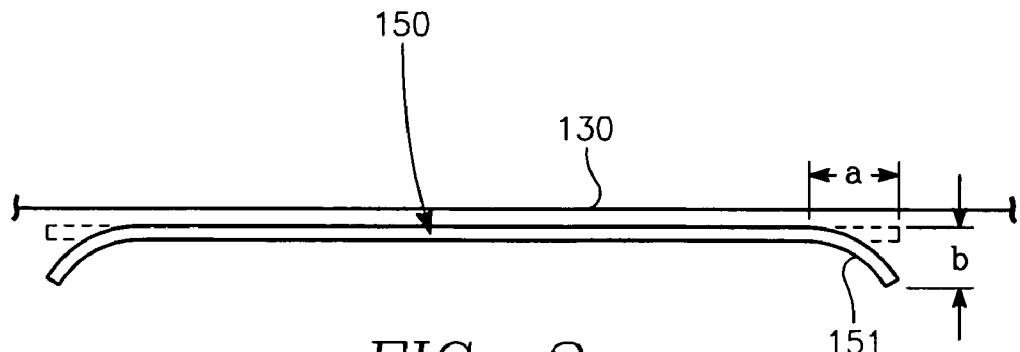
FIG. 2 is an enlarged view of a cathode electrode in the embodiment of FIG. 1.

Referring to FIG. 2, the mesh electrode 150 is generally flat across its diameter with the exception of an annular edge portion 151, which extends downwardly away from the wafer support surface 130. In the embodiment of FIG. 2, the annular edge portion 151 curves downwardly in an arc. As will be discussed below, the width "a" and depth "b" of the downward arc subtended by the annular edge portion 151 are selected in accordance with width A and amplitude B of an edge non-uniformity in the electric field depicted in FIG. 3A. Generally, the width "a" defines the extent of the annular edge portion 151, and generally can be between 5% and 50% of the radius of electrode 150. The electrode 150 may be on the order of a fraction of a mm in thickness. In this case, the depth "b" of the arc may correspond to several mm. Because the wafer support surface 130 is entirely flat across its diameter, the insulating layer 155 separating the electrode 150 from the wafer support surface 130 has a constant thickness across the major portion of the electrode 150 (e.g., of about 1 mm) but has a thickness that increases with radius over the peripheral edge portion 151. The diameter of the electrode 150 is approximately the same as the diameter of the wafer 125, about 300 mm in a typical case.

Figure 3A:
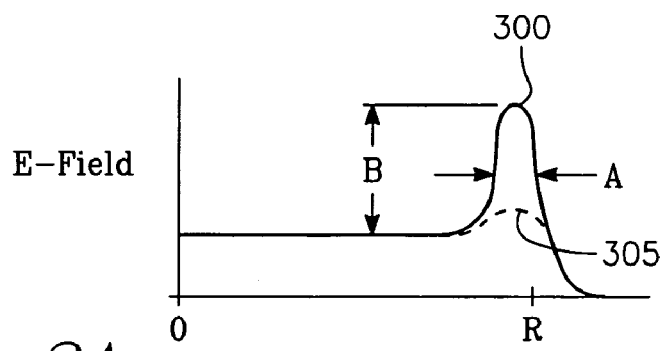
FIGS. 3A, 3B and 3C are graphs of distributions across a wafer surface of electric field, retained ion implantation dose and etch rate, respectively.

FIG. 3A is a graph depicting the electric field strength at the surface of the wafer 125 as a function of radial position. The solid line of FIG. 3A depicts the field strength for a completely flat version of the electrode 150 having no curvature (indicated in dashed line in FIG. 1). FIG. 3A shows that across most of the wafer surface, the electric field is uniform (flat), except for a small portion at the wafer edge, where a large peak 300 in the electric field occurs. The peak 300 is attributable to the curvature of the electric field at the edge of the completely flat (dashed line) version of the electrode. Bending down the annular edge portion 151 changes the electric field so as to reduce the peak 300 to a very small peak 305 indicated in dashed line. The depth "b" of the curved edge portion 151 (FIG. 2) is selected in accordance with the height B of the electric field peak 300. The width "a" of the curved edge portion 151 (FIG. 2) is selected in accordance with the width A of the pack 300.

Figure 3B:
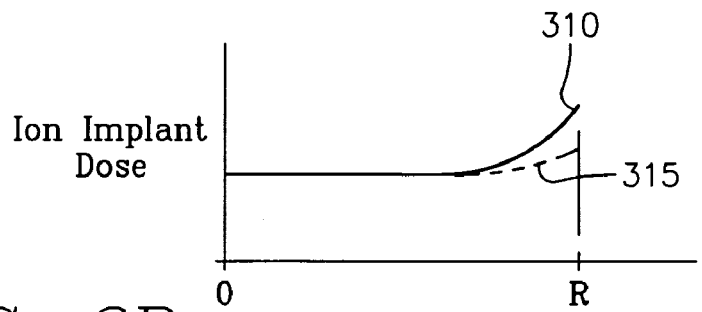

The non-uniformity or peak 300 in the electric field shown in FIG. 3A is indicative of a curvature in the electric field that focuses ion trajectories toward the wafer edge, to produce a peak in ion flux at the edge of the wafer 125, giving rise to a similar peak 310 in retained ion implant dose distribution shown in FIG. 3B.

The peak 310 in the ion implant dose distribution of FIG. 3B is reduced to a smaller peak 315 when the electrode peripheral edge portion is curved downwardly in accordance with the solid line topology of FIG. 2.

Figure 3C:

The peak 300 in the electric field shown in FIG. 3A also can produce a corresponding peak 320 (FIG. 3C) in polysilicon etch rate distribution during ion implantation. This is attributable to greater ion energy in the region of the peak in electric field. The etch rate distribution peak 320 is reduced to a smaller peak 325 (shown in dashed line in FIG. 3C) by transitioning to the curved electrode topology depicted in solid line in FIG. 2.

The cathode electrode depicted in solid line in FIG. 2 provides more uniform distribution of retained implanted dose, and a more uniform distribution of polysilicon etch rate during ion implantation. The retained implanted dose distribution is more uniform because the electric field non-uniformity or curvature at the wafer edge is reduced. This reduction in electric field non-uniformity at the wafer edge also reduces non-uniformity in ion energy distribution at the wafer edge.

Figure 4:
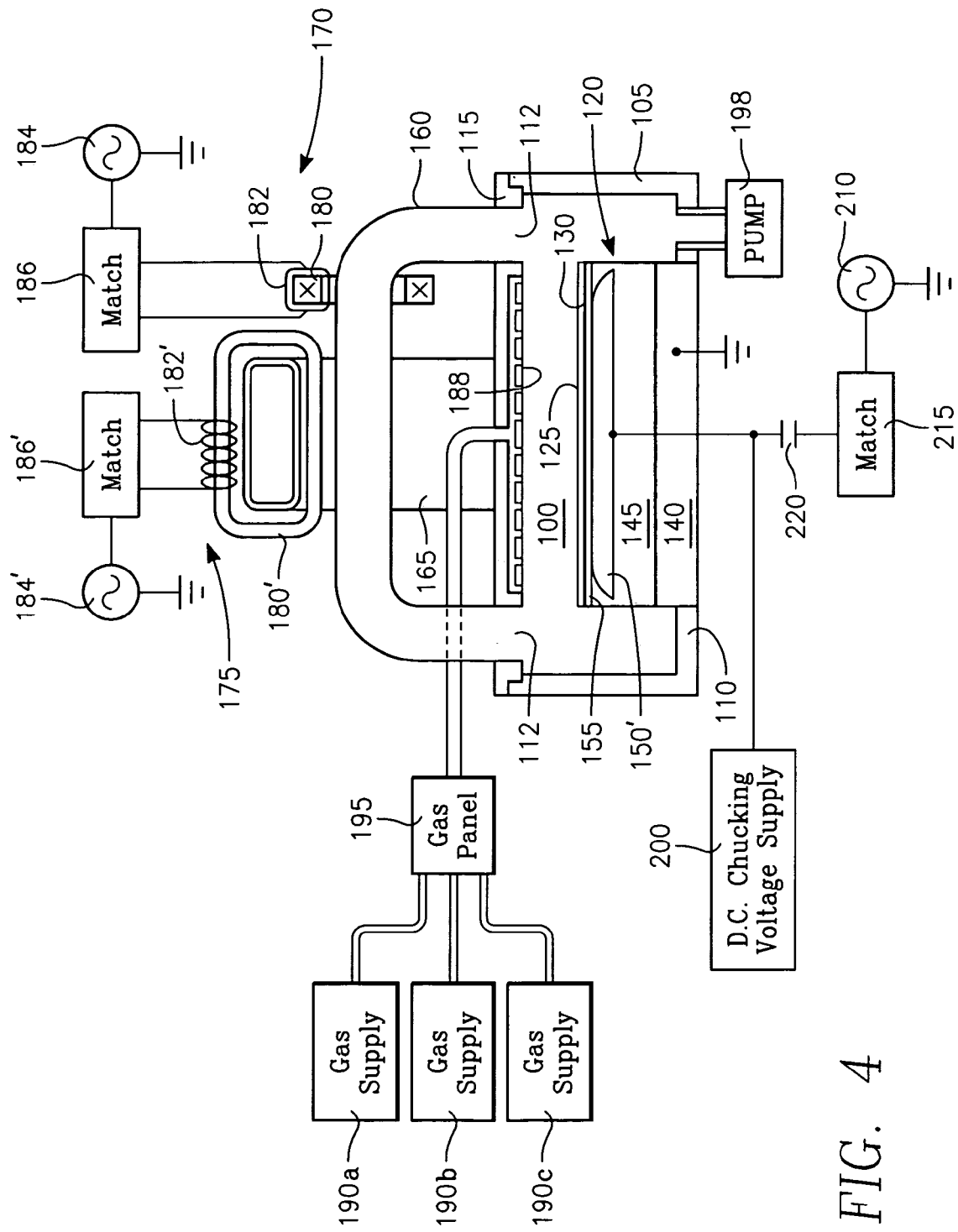
FIG. 4 illustrates a reactor in accordance with a second embodiment.

FIG. 4 depicts a modification of the embodiment of FIG. 1 in which the curved thin mesh electrode 150 is replaced by a solid thick electrode 150' having the same top surface topology.

While the foregoing is directed to embodiments of the present invention, other and further embodiments of the invention may be devised without departing from the basic scope thereof, and the scope thereof is determined by the claims that follow.

What is claimed is:

1. A reactor for performing plasma processing on a semiconductor workpiece, comprising:
    a reactor chamber and a workpiece support surface in said reactor chamber;
    a process gas injection apparatus coupled to the chamber;
    a process gas supply;
    an RF plasma source power applicator for generating a plasma in the chamber from the process gas, and an RF power supply coupled to said RF plasma source power applicator;
    a disk-shaped electrode underlying workpiece support surface and insulated from the workpiece and having a circumferential edge underlying a circumferential edge of the workpiece;
    an RF bias power source coupled to said electrode; and
    said electrode being generally flat and having a peripheral edge annulus curving away from said workpiece support surface with increasing radius, said peripheral edge annulus corresponding to a small fraction of an area of said electrode.

2. The apparatus of claim 1 wherein said peripheral edge annulus has a width that is between 5% and 50% of the radius of said workpiece.

3. The apparatus of claim 1 wherein said peripheral edge annulus has a depth of curvature on the order of several mm.

4. The apparatus of claim 1 wherein said peripheral edge annulus has a width corresponding to a width of an electric field peak of an electrode having a completely flat shape.

5. The apparatus of claim 1 wherein said peripheral edge annulus has a depth of curvature sufficient to compensate for an electric field peak characteristic of an electrode having a completely flat shape.

6. The apparatus of claim 1 wherein said peripheral edge annulus is about 300 mm in diameter and has a depth of curvature of several mm.

7. The apparatus of claim 6 wherein said electrode comprises a conductive mesh having a thickness on the order of a fraction of a mm, and said peripheral edge annulus has a depth of curvature of several mm.

8. The apparatus of claim 1 wherein said electrode is encapsulated in an insulating material, said insulating material forming said workpiece support surface over said electrode.

9. The apparatus of claim 8 wherein said workpiece support surface is flat across its diameter, whereby said insulating material has a thickness over said peripheral edge portion that increases with radius.

10. A wafer support pedestal for use in a plasma reactor, comprising:
    a workpiece support surface for supporting a workpiece of a particular workpiece diameter;
    a diskshaped electrode underlying workpiece support surface and insulated from the workpiece support surface and having a diameter corresponding to said workpiece diameter; and
    said electrode being generally flat and having a peripheral edge annulus curving away from said workpiece support surface with increasing radius, said peripheral edge annulus corresponding to a small fraction of an area of said electrode.

11. The apparatus of claim 10 wherein said peripheral edge annulus has a width that is between 5% and 50% of the radius of said workpiece.

12. The apparatus of claim 10 wherein said peripheral edge annulus has a depth of curvature on the order of several mm.

13. The apparatus of claim 10 wherein said peripheral edge annulus has a width corresponding to a width of an electric field peak of an electrode having a completely flat shape.

14. The apparatus of claim 10 wherein said peripheral edge annulus has a depth of curvature sufficient to compensate for an electric field peak of an electrode having a completely flat shape.

15. The apparatus of claim 10 wherein said peripheral edge annulus is about 300 mm in diameter and has a depth of curvature of several mm.

16. The apparatus of claim 15 wherein said electrode comprises a conductive mesh having a thickness on the order of a fraction of a mm, and said peripheral edge annulus has a depth of curvature of several mm.

17. The apparatus of claim 10 wherein said electrode is encapsulated in an insulating material, said insulating material forming said workpiece support surface over said electrode.

18. The apparatus of claim 17 wherein said workpiece support surface is flat across its diameter, whereby said insulating material has a thickness over said peripheral edge portion that increases with radius.

* * * * *